(12) United States Patent
Perkins et al.

(10) Patent No.: US 10,316,405 B2
(45) Date of Patent: Jun. 11, 2019

(54) DEPOSITION OF INTEGRATED COMPUTATIONAL ELEMENTS (ICE) USING A TRANSLATION STAGE

(71) Applicant: Halliburton Energy Services, Inc., Houston, TX (US)

(72) Inventors: David L. Perkins, The Woodlands, TX (US); Robert Paul Freese, Pittsboro, NC (US); Christopher Michael Jones, Houston, TX (US); Richard Neal Gardner, Raleigh, NC (US)

(73) Assignee: Halliburton Energy Services, Inc., Houston, TX (US)

( * ) Notice: Subject to any disclaimer, the term of this patent is extended or adjusted under 35 U.S.C. 154(b) by 0 days.

(21) Appl. No.: 15/303,653

(22) PCT Filed: Jun. 30, 2014

(86) PCT No.: PCT/US2014/044818
§ 371 (c)(1),
(2) Date: Oct. 12, 2016

(87) PCT Pub. No.: WO2016/003401
PCT Pub. Date: Jan. 7, 2016

(65) Prior Publication Data
US 2017/0029939 A1    Feb. 2, 2017

(51) Int. Cl.
*G02B 5/28* (2006.01)
*C23C 14/30* (2006.01)
(Continued)

(52) U.S. Cl.
CPC .............. *C23C 14/54* (2013.01); *C23C 14/30* (2013.01); *C23C 14/505* (2013.01);
(Continued)

(58) Field of Classification Search
CPC ....... C23C 14/54; C23C 14/30; C23C 14/505; E21B 47/123; G01B 11/0625; G02B 5/28
See application file for complete search history.

(56) References Cited

U.S. PATENT DOCUMENTS

| 5,454,919 A | 10/1995 | Hill et al. |
| 7,138,156 B1 * | 11/2006 | Myrick ................. G02B 5/285 427/10 |

(Continued)

FOREIGN PATENT DOCUMENTS

| JP | 2005120441 A | 5/2005 | |
| WO | 2013162914 A1 | 10/2013 | |
| WO | WO-2013162914 A1 * | 10/2013 | ............. G01K 13/00 |

OTHER PUBLICATIONS

International Search Report and Written Opinion issued in corresponding PCT application No. PCT/US2014/044818, dated Mar. 30, 2015, 2 pgs.

(Continued)

*Primary Examiner* — Kelly M Gambetta
(74) *Attorney, Agent, or Firm* — Chamberlain Hrdlicka (57) ABSTRACT

The disclosed embodiments include a system and method for manufacturing an integrated computational element (ICE) core. The method comprises varying a distance between a thermal component relative to a substrate holder that holds at least one substrate during a thin film deposition process to improve uniformity of the ICE core. In one embodiment, varying the distance between the thermal component relative to the substrate holder that holds at least one substrate includes moving at least a portion of the substrate holder in at least one direction relative to the thermal component and also moving the thermal component in at least one direction relative to the substrate holder during the thin film deposition process.

17 Claims, 3 Drawing Sheets

(51) Int. Cl.
*C23C 14/50* (2006.01)
*C23C 14/54* (2006.01)
*E21B 47/12* (2012.01)
*G01B 11/06* (2006.01)

(52) U.S. Cl.
CPC ........ *E21B 47/123* (2013.01); *G01B 11/0625* (2013.01); *G02B 5/28* (2013.01)

(56) References Cited

U.S. PATENT DOCUMENTS

| | | |
|---|---|---|
| 2002/0012746 A1* | 1/2002 | Mearini ................. B82Y 10/00 427/164 |
| 2002/0075486 A1 | 6/2002 | Zhang et al. |
| 2003/0168613 A1* | 9/2003 | Lee ....................... B82Y 10/00 250/492.1 |
| 2011/0262656 A1 | 10/2011 | Nagae et al. |
| 2017/0010221 A1 | 1/2017 | Heaton |

OTHER PUBLICATIONS

Olusola O. Soyemi et al., "A Simple Optical Computing Device for Chemical Analysis", Proceedings of SPIE, vol. 4284, May 15, 2001, pp. 17-28, XP055073223.

* cited by examiner

DEPOSITION OF INTEGRATED COMPUTATIONAL ELEMENTS (ICE) USING A TRANSLATION STAGE

TECHNICAL FIELD

The present disclosure relates generally to the thin film deposition, and more particularly, to systems and methods for deposition of integrated computational elements (ICE) using a translational stage.

BACKGROUND

In thin film deposition processes, the substrate, substrate platter, or substrate holder is almost always a flat platen. Due to the flat nature of the platen, non-uniformities in thickness are created in thermal deposition processes. The distance of the platen from the fixed evaporation source is less in the center than at the edge, and more material is deposited per unit time at the center than at the edge. For example, if the center of the source were placed directly under the rotating substrate platen, then a higher rate of deposition would be observed in the middle of the platen, with thinner layers observed on the edges.

BRIEF DESCRIPTION OF THE DRAWINGS

Illustrative embodiments of the present invention are described in detail below with reference to the attached drawing figures, which are incorporated by reference herein and wherein.

DETAILED DESCRIPTION OF THE DRAWINGS

The illustrative embodiments provide a system and method for thin film deposition including controlling the generation or manufacturing of integrated computational elements (ICE) Cores for detecting a number of properties in a test sample. As used herein the terms "manufacture" or "manufacturing" are defined as making, producing, generating, fabricating, growing, and/or creating ICE Cores in accordance with the disclosed embodiments. ICE Cores are one embodiment of a multivariate optical computing device, system, or component for analysis of a test sample. The test sample may represent any combination of liquids, gasses, slurries, mods, polymers, multiphasic materials, hydrocarbon fluids, powders, and solids. The ICE Cores may be utilized on testing samples in any number of phases, such as solids, liquids, gases, slurries, emulsions, powders, and multi-phase solutions.

The ICE Cores may also be utilized in any optical mode, such as transmission, reflection, total internal reflection, fluorescence, Rayman, Raleigh scattering, Brillion scattering, fiber optic, distributed fiber optic, and so forth. The ICE Cores may have the same accuracy as laboratory quality optical spectrometers without using spectra, spectrometers, or conventional notch filters. In one embodiment, the ICE Cores may perform a specific calculation/regression to detect and/or quantify a specific analyte of interest, or characteristic, of a given test sample. The ICE Cores may be utilized nondestructively, non-invasively, in situ, and/or in real-time. For example, the ICE Cores may be utilized in harsh environments, such as downhole conditions of a wellbore. In addition, the ICE Cores may also be utilized in laboratories, mobile equipment centers, impromptu workstations, or other locations or environments.

In one embodiment, the deposition processes that control the optical function of the ICE Cores may be measured and controlled in real-time. For example, the ICE Core fabrication system may utilize sensors, such as crystal monitors, optical monitors, in-situ spectrometers, and in-situ ellipsometers. The optical function of the ICE Core may be defined as the electromagnetic intensity (e.g., transmission, absorption, and reflection) of the ICE Core as a function of wavelength. In one embodiment, ion assisted electron beam (e-beam) deposition may be utilized for each layer or step of the deposition process.

Additionally, the disclosed embodiments may include a system and method for translating a position of a thermal source (e.g., silicon or silicon dioxide (silica)) and/or a substrate holder that may be used in conjunction with or separate from the disclosed ion assisted electron beam deposition process.

Figure 1:
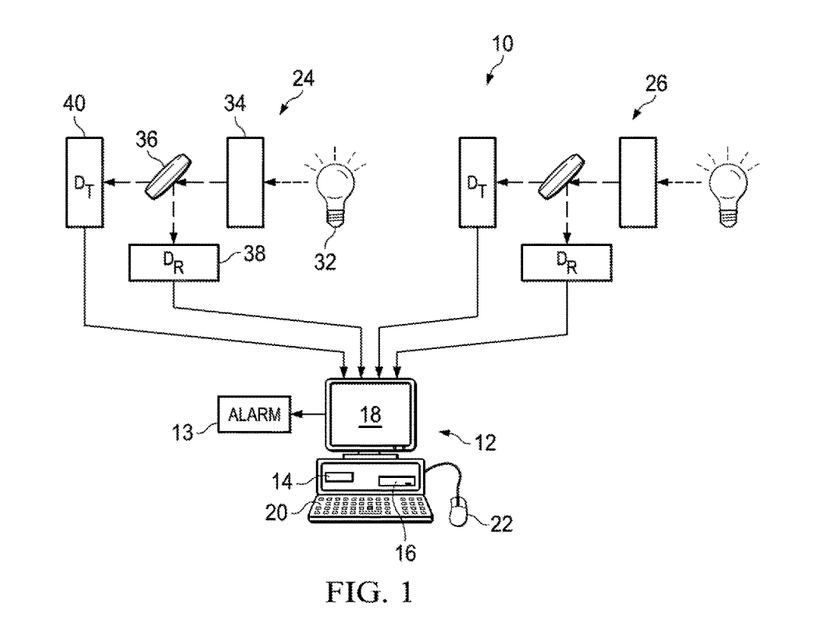
FIG. 1 is a schematic diagram of a system for monitoring test samples in a natural resource environment employing an in situ optical analysis device in accordance with an illustrative embodiment.

FIG. 1 is a schematic diagram of a system 10 for monitoring test samples in a natural resource environment employing in-situ optical analysis device in accordance with an illustrative embodiment. In one embodiment, the system 10 may be utilized to determine a number of properties of test samples (e.g., crude petroleum, water, mixtures, liquids, etc.) either down hole in a drilling well, laboratory, pipeline, or other environment. The term "down hole" means located in a well or a stream connected to a well or connected to any of one or more reservoirs whose fluids are subject to being pumped to the surface at a well. In practice, numerous reservoirs may be interconnected by a web of streams all feeding a common well head. The term pipeline means a pipe employed to convey petroleum from a field well head to a remote location. Pipes are employed down hole and in pipelines. The term "pipe" includes down hole pipes or pipeline pipes. Down hole pipes may be vertical, horizontal, or have other spatial relationships.

The determined properties may be utilized for analysis, to determine petroleum flow, or analysis of applicable mixtures and materials, and other relevant determinations. As used herein, the term "property" means chemical or physical characteristic, composition, properties, or elements contained in the test sample (i.e., petroleum or which forms the petroleum composition and which includes, but is not limited to SARA (saturates, asphaltene, resins, aromatics) composition and content, solid particulate content such as dirt, mud, scale and similar contaminants, porosity, pH, total dissolved solids, ionic content (i.e., $H_2O$ ion-composition and content), hydrocarbon composition and content, gas composition C1-C6 and content, $CO_2$, $H_2S$ and correlated PVT properties including GOR (gas-oil ratio), bubble point, density, particle shape, particle distribution, and viscosity among other properties. For example, crude petroleum may include aromatics, resins asphaltenes, and saturates.

System 10 may include apparatuses located at and in contact with flowing crude petroleum and which components are located down hole or on a pipeline to determine in real-time the properties of the petroleum which is flowing in pipes underground or in the pipeline. As a result, the apparatuses of the system 10 are subject to the extreme temperatures and pressures of the underground streams, but yet do not employ costly spectroscopic instruments as used in the prior art system, but rather rugged reliable optical analysis devices, such as ICE Cores. In another embodiment, the system 10 may be utilized for non real-time analysis of test samples in a mobile or home facility, sample container, or other location or container after retrieval of the test sample.

In one embodiment, system 10 may include a computer 12 including a microprocessor 14, memory 16 which may include one or more static or dynamic memories or caches (e.g., hard drive, ROM, RAM, etc.) for storing the analysis program and operating system program and determined data among other information as known in the art of spectral analysis as understood by one of ordinary skill. The computer 12 may include a display 18, a keyboard 20, and a mouse 22.

The microprocessor 14 may be circuitry or logic enabled to control execution of a set of instructions. The processor 14 may be one or more microprocessors, digital signal processors, application-specific integrated circuits (ASIC), central processing units, or other devices suitable for controlling an electronic device including one or more hardware and software elements, executing software, instructions, programs, and applications, converting and processing signals and information, and performing other related tasks. The processor 14 may be a single chip or integrated with other computing, communications, exploration devices, down hole tools.

The memory 16 may be a hardware element, device, or recording media configured to store data for subsequent retrieval or access at a later time. The memory 16 may be static or dynamic memory. The memory 16 may include a hard disk, random access memory, cache, removable media drive, mass storage, or configuration suitable as storage for data, instructions, and information. In one embodiment, the memory 16 and processor 14 may be integrated. The memory may use any type of volatile or non-volatile storage techniques and mediums.

In one embodiment, the computer may be located at central location remote from the remainder of the system 10 comprising optical petroleum property sensing and optical analyzing devices 24 and 26. While two devices are shown, this number of devices is by way of illustration and more or fewer devices may be used in practice. For example, each optical analyzing device 24 and 16 may be utilized for detecting and analyzing light interacted with the associated sample or mixture, such as petroleum with varying properties of interest. The optical analyzing devices 24 and 26 may each measure multiple properties or a single property as needed. The optical analyzing devices may be utilized in combination to provide an overall picture of the condition of the petroleum and the location.

The optical analyzing devices 24 and 26 are rugged and may be configured to withstand the temperatures and pressures in-situ at the pipes and thus are emplaced for short term, long term, or permanent use. The optical analyzing devices 24 and 26 are a marked improvement over present analyzing systems which are not rugged, are not automatic and are not for relatively long term use. The optical analyzing devices 24 and 26 may be specifically manufactured to test and analyze one or more properties of a test sample. In other embodiments, the optical analyzing devices 24 and 26 may be manufactured for one time, temporary, or disposable use.

The number of optical analyzing devices 24 and 26 is arbitrary and is not intended to convey any significance. The number of optical analyzing devices 24 and 26 in the system 10 depends on the needs of one or more users, required analysis, the number of pipes/wells, and the number of properties being monitored. Communications within the system 10 may occur in real-time or via any number of subsequent communications, data transfers, or synchronization processes. A user may also initiate a communication, test, analysis, or other process using the system 10.

It is contemplated that the number of optical analyzing devices 24 and 26 of a system 10 is not limited to measuring the properties of a test sample at a single location. The computer 12 may be programmed to communicate with or monitor a large number of optical analyzing devices 24 and 26 associated with and located in respect of a number of different locations. Thus the properties of a test sample flowing independently in different location may be monitored simultaneously by one computer 12 which may also be programmed to correlate a number of different properties as being related to a flow assurance problem in one reservoir system. The computer 12 may represent one or more computing or communications devices, systems, equipment, or components.

The communications within the system 10 may occur directly or through one or more networks including, a publicly switched telephone network, cell or wireless networks (e.g., 3G, 4G, LTE, PCS, GMSR, etc.), Ethernet networks, or so forth. The computer 12 may also be coupled to an alarm output device 13 which may provide an audible alarm, a visual alarm or both.

In one embodiment, the computer 12 may monitor pipes, streams, reservoirs, and well bores to give a picture of the petroleum and other test samples flowing, stored, or being retrieved. As a result, the optical analyzing devices may monitor a number of properties instantaneously or at the convenience of one or more users. As a result, problems or issues may also be efficiently monitored, detected, and logged to take any number of corrective actions for a reservoir, stream, pipeline, or so forth. One or more thresholds may be utilized for distinct properties to perform more thorough analysis or perform different tests.

The optical analyzing devices 24 and 26 may be relatively low cost and rugged and may be implemented in many more locations and streams than otherwise possible with other systems. In one embodiment, the optical analyzing device 24 (described as a representative device) may include a light source 32, a test sample 34 being monitored, an ICE Core 36 operating an optical regression calculation device, a detector 38 for detecting light reflected from ICE Core 36, and a detector 40 for detecting the light transmitted by ICE Core 36. The ICE Core 36 may be a unique optical calculation device that includes multiple layers specially sized, shaped, and configured to determine properties of the test sample.

Figure 2:
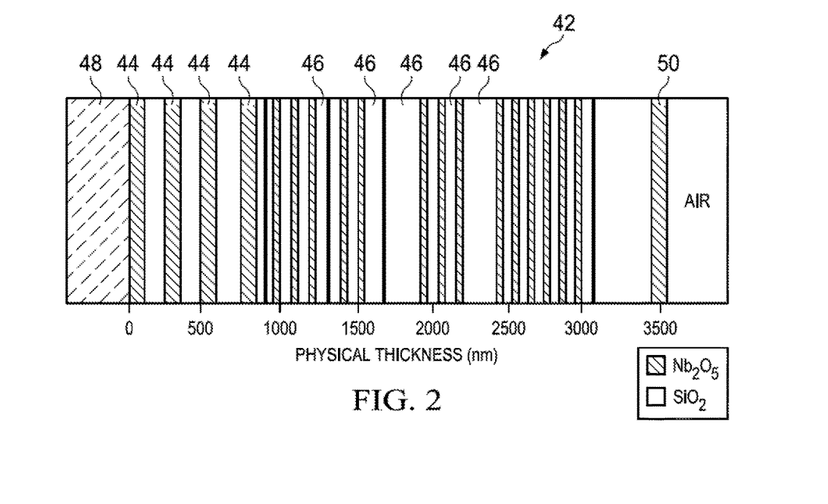
FIG. 2 is a side elevation sectional view of an ICE Core in accordance with an illustrative embodiment.

FIG. 2 is a side elevation sectional view of an ICE core 42 in accordance with an illustrative embodiment. In FIG. 2, the ICE core 42 may include a number of alternating layers 44 and 46 respectively of $Nb_2O_5$ and $SiO_2$ (quartz). In one embodiment, the layers 44 and 46 may be deposited on a glass substrate 48 such as, but not limited to, silicon or silica. The other end layer 50 of the optical calculating layers may be exposed to the environment of the installation. The number of layers and the thickness of the layers may be determined from and constructed from the spectral attributes determined from a spectroscopic analysis of a property of a sample mixture using a conventional spectroscopic instrument. In one embodiment, the combination of layers corresponds to the signature of the property of interest according to the spectral pattern of that property. The layers of the ICE Core 42 may be automatically controlled and deposited to correspond to the signature of the property.

The spectrum of interest of a given property typically includes any number of different wavelengths. The ICE Core 42 is provided for illustrative purposes only. The number of layers and their relative thicknesses of the ICE Core bear no correlation to any sample property to which the illustrative embodiments are directed, is given for comprehension purposes only, and are also not to scale. The thickness of the layers may be in the order of microns or nanometers.

The multiple layers and substrate have different complex indices of refraction. By properly selecting the materials of the substrate and layers and the layer thickness and spacing, the optical analysis device may be manufactured to selectively pass predetermined fractions of light at different wavelengths. Each wavelength is given a predetermined weighting or loading factor. The thicknesses and spacing of the layers may be determined using a variety of approximation methods from the spectrograph of the property of interest. The weightings that the ICE Core 42 layers apply at each wavelength are set to the regression weightings described with respect to a known equation, or data, or spectral signature as are known in the art. The ICE Core 42 performs the dot product of the input light beam into the optical calculation device and a desired loaded regression vector weightings for each wavelength. The ICE Core 42 output light intensity is directly related to and is proportional to the desired sample property. The output intensity represents the summation of all of the intensities of the passed wavelengths measured by an optical transducer.

These wavelengths may be weighted proportionately by the construct of the corresponding optical analysis device layers. The resulting layers together may produce an optical analysis device, such as ICE Core 42 that outputs modifies light intensity from the input beam. The transmitted and reflected light intensities, as measured by detectors 38 and 40 and processed by computer 12, represent the dot product of the input light and the loaded vectors of that property (e.g., resin). For example, the output optical analysis device intensity value is proportional to the amount of resin in the crude petroleum being examined. In this way, an ICE Core is produced for each property to be determined in the test sample.

Such ICE cores represent pattern recognition devices and components which produce characteristic output patterns representing a signature of the spectral elements that define the characteristic or property of interest. The intensity of the light output is a measure of the proportional amount of the characteristic in the test sample being evaluated. In one embodiment, outputs from a number of ICE cores in the form of electrical signals may be utilized to represent the characteristic or property of interest in the test sample.

There is good correlation between the predicted characteristic such as aromatics, for example, and the measured amount of characteristic. Thus, a system and method has been described for determining at least one characteristic of the test sample that may include causing the test sample to produce interacted light from incident light; performing a regression calculation or other processing on the interacted light with an optical analysis device responsive to the interacted light incident thereon to produce at least one output signal manifesting the calculation and the corresponding at least one property; and determining the at least one property of the test sample from the at least one output signal.

Figure 3:
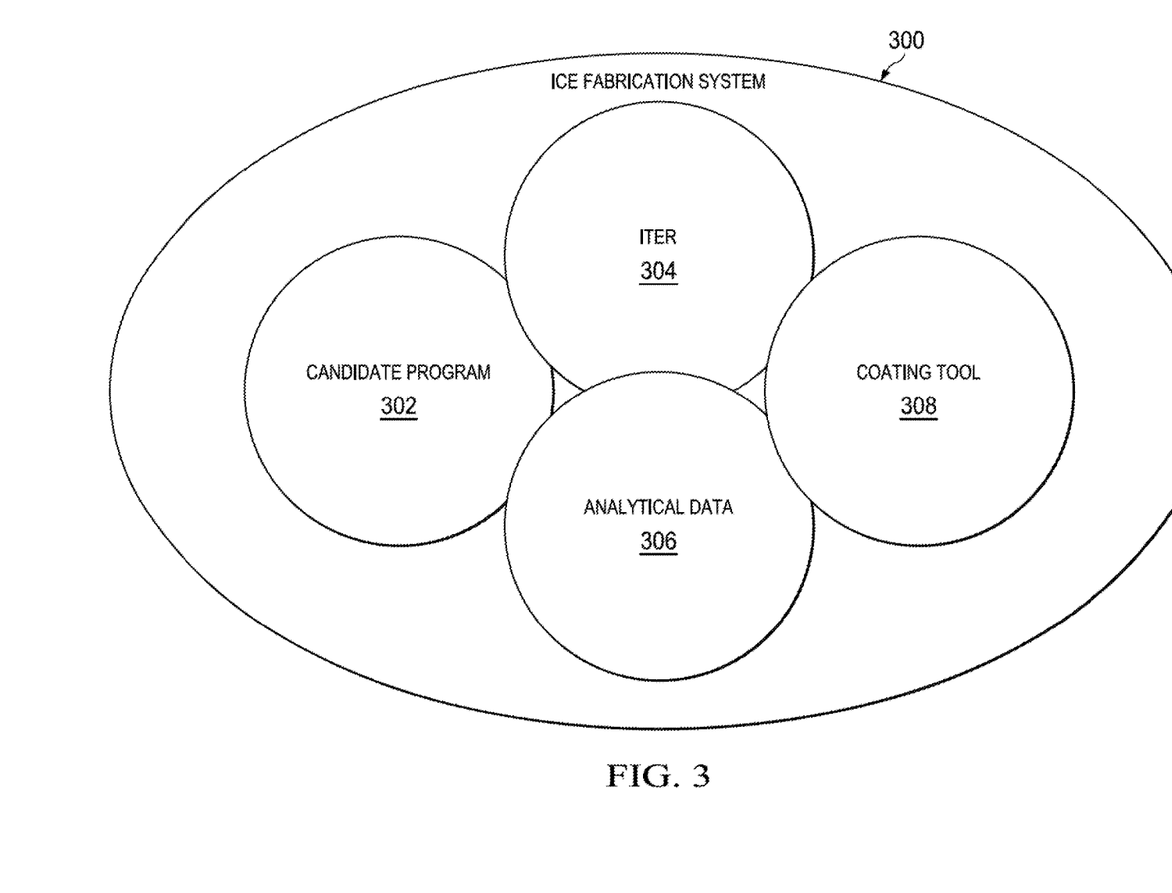
FIG. 3 is a diagram of an ICE Core fabrication system in accordance with an illustrative embodiment.

FIG. 3 is a diagram of an ICE Core fabrication system 300 in accordance with an illustrative embodiment. The ICE Core fabrication system 300 may include any number of hardware, software, and firmware components. In one embodiment, the ICE Core fabrication system 300 may include a candidate program 302, iteration application (ITER) 304, analytic data 306, and a coating tool 308 that communicate directly or indirectly through one or more networks. The ICE Core fabrication system 300 may include any number of software modules, applications, or logic configured to execute a set of instructions as described herein.

In one embodiment, the ICE Core fabrication system 300 may also include any number of servers, databases, routers, terminals, semiconductor manufacturing tools, peripherals, or so forth.

In one embodiment, the candidate program 302 may be configured to create filter information for the ICE Cores. For example, the candidate program 302 may utilize analyte concentration data, and substrate and material complex indices of refraction information (n, k), to determine layer properties. Manufacturing of various ICE Cores may require recently obtained optical constraints to formulate the materials deposited in the different layers of the ICE cores, the thickness, treatments of individual layers, and other applicable information. The optical constraints may be sent and received automatically or in response to user interaction.

ITER 304 may be a multi-application group of compiled programs that communicates with the coating tool 308 and optimizes filter designs based on feedback from the candidate program 302. For example, the ITER 304 may enable optimization and/or automation of the deposition process such as pseudo layer control and modification and/or allowing slack layer additions required to yield a filter.

The analytical data 306 may be data acquired from multiple locations within the manufacturing chamber. The analytical data 306 may be acquired by optical monitors, spectrometers, ellipsometers, thermometers, barometers, gas sensors, quartz crystal microbalances, thermometers, or other measuring or monitoring equipment internal or external to the ICE core fabrication system 300. The analytical data 306 may be modeled and processed as consistent with the filter run objectives.

The coating tool 308 may be a manufacturing tool for controlling and depositing each layer. In one embodiment, the coating tool 308 is a thin film deposition production system. The coating tool 308 may be configured to perform different deposition processes, such as thermal induction evaporation, ion-assisted thermal induction evaporation, RF bias clean, magnetron sputtering, and plasma enhanced CVD. The coating tool 308 may include an isolated process chamber configured to apply a vacuum to the ICE Cores as they are manufactured. In one embodiment, the coating tool 308 may utilize trigger thresholds and may wait for a reply.

Figure 4:
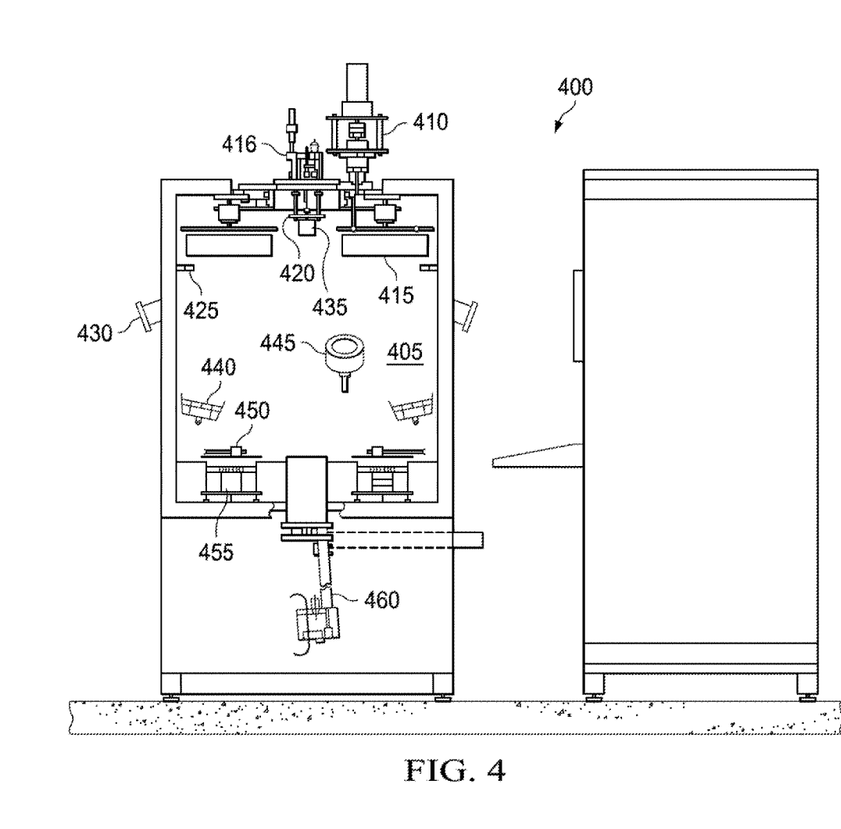
FIG. 4 is a schematic side view of an ICE Core fabrication system in accordance with an illustrative embodiment.

FIG. 4 is a schematic view of one example of an ICE Core fabrication system 400 in for manufacturing ICE Cores in accordance with the disclosed embodiments. For example, in one embodiment, the ICE Core fabrication system 400 may be utilized to perform thin-film deposition to manufacture ICE Cores. Any number of physical vapor deposition (PVD) and chemical vapor deposition (CVD) may be utilized. In one embodiment, the ICE Core fabrication system 400 may include a vacuum chamber 405, a planetary drive 410, one or more planetary assemblies 415, a spectrometer 416, shuttered sensors 425, ellipsometer ports 430, quartz heaters 440, an ion source 445, source shutters 450, one or more thermal sources (e.g., e-beam sources 455, thermal evaporation sources, etc.), and an optical monitor assembly 460. In one embodiment, the ICE Core fabrication system 400 may be connected to one or more computing devices for managing the various components and the layers deposited on a substrate.

In one embodiment, the ICE Core fabrication system 400 may be configured to control deposition of a number of layers and properties of the layers. For example, the properties of the layers that may be controlled may include at least an index of refraction, optical absorption coefficient, physical fitness, and optical thickness. In one embodiment, the ICE Core fabrication system 400 may utilize a regression vector to establish the transmission, reflection, and absorption functions of the ICE Cores before, during, and after generation. The ICE Core may vary in thickness and layers. For example, the ICE Core may vary between approximately 5 nm and approximately 50 μm and may have between approximately 2 and approximately 50 layers. However, in other embodiments, the thickness may be increased and decreased based on application, a single layer may be utilized or an extremely large number of layers may be used based on very complex applications of the ICE Core.

In one embodiment, the vacuum chamber 405 may be a rigid enclosure in which air or other gases are removed by a vacuum pump (not shown). The vacuum chamber 405 may include any number of ports allowing distinct components, such as instruments, sensors, sources, gas sources, and so forth, to be grounded to or installed within the vacuum chamber 405 for utilization during the ICE Core fabrication process. The vacuum chamber 405 may be formed of metals, such as stainless steel, aluminum, mild steel, or brass, high-density ceramics, glass, acrylics, and other materials suitable for the different elements and mixtures deposited and utilized within the vacuum chamber 405. In another embodiment, and evaporation cloud emitted within the vacuum chamber 405 may be masked to enhance uniformity of deposition. Masking is accomplished, but is not limited to, metal shields before the planetary assembly 415 with apertures allowing the evaporation cloud to pass to the planetary assembly 415. The vacuum chamber 405 may also vary the pressure within the vacuum chamber as necessary for each step in the process. The vacuum chamber 405 may introduce any number of background or reactant gases during the process.

The vacuum chamber 405 may include any number of supports, ports, adapters, interfaces, or so forth. The vacuum chamber 405 may include any number of electrical, gas, suction, disposal, or other inputs or outputs. For example, the background gases utilized within the vacuum chamber 405 may be varied based on the deposition or other process being performed upon the substrates/ICE Cores. The vacuum chamber 405 may also include any number of other securing panels, assemblies, or so forth. For example, the vacuum chamber 405 may include leveling feet to ensure the vacuum chamber 405 is maintained level as well as any number of peripherals, such as keyboards, displays, a mouse, touchscreen, or so forth.

In one embodiment, the planetary drive 410 may be a motion device or system for moving a planetary system with at least one planetary assembly 415 holding substrates or ICE Cores during the manufacturing process. The planetary assembly 415 may also be referred to as a substrate platen. The planetary drive 410 may represent a single or multi component planetary mechanism. In some embodiments, the planetary drive 410 may be configured to move in three dimensions. For example, the planetary drive 410 may rotate as well as tilt to provide motion along three different axes. In one embodiment, the planetary drive 410 may include one or more motors, and a gearbox including, for example, a central or "sun" gear which engages with a number of surrounding or planet gears. The planet gears may be held in place by a cage or carrier that fixes the planet gears in orbit relative to each other. In one embodiment, each of the individual planets within the planetary assembly 415 is individually rotatable on their respective axis as well as tilt to provide motion along three different axes. The one or more motors may smoothly rotate the planetary assembly. For example, the ICE Cores may be rotated as each new layer is deposited to ensure uniform deposition. The planetary drive 410 and the planetary assembly 415 provide stability, rotational stiffness, and consistent rotational speeds for utilization in the ICE Core manufacturing process.

In one embodiment, the planetary drive 410 may move the planetary assembly 415, and/or the individual planets within the planetary assembly 415, and the corresponding substrates/ICE Cores during deposition to increase uniformity in the ICE Cores. For instance, in one embodiment, the ion source 445 and the e-beam sources 455 may also be moved during deposition or other processes (e.g., secondary planetary drive systems). For example, a distance between the substrate attached to the planetary assembly 415 (or other types of substrate holder) and the thermal source (e.g., e-beam sources 455) may be varied during deposition to affect the shape of the ICE Cores for improving uniformity of the deposited material. Rotating one or more of the planetary assembly 415, ion source 445, and the e-beam sources 445 may be utilized to maximize the uniformity, density, and to compensate for the point source nature of the evaporation plume from the e-beam source 455. As an example, in one embodiment, the thermal source may move in the x, y, and/or z direction relative to the substrate holder, while the substrate holder maintains its normal position or movement. The x-direction is movement from side to side, the y-direction is movement from front to back, and the z direction is up and down movement. In certain embodiments, the movements may be predetermined prior to the deposition process to improve uniformity of the ICE core.

Alternatively, in some embodiments, the thermal source may move in the x, y, and/or z direction relative to the substrate holder, while the substrate holder and/or individually controlled sections of the substrate holder (e.g., one or more planets in the planetary assembly 415) may also move in the x, y, and/or z direction, as well as tilt, relative to the thermal source to provide a more uniform deposition layer. Movement of both the thermal source and the substrate holder may be advantageous as the overall system can be smaller because each would only have to move a portion (e.g., half) of the desired distance. Movement of the substrate holder such as the planetary assembly 415 may include moving the outer planetary system while maintaining the normal position or not moving of the individual planets; moving the outer planetary system and moving the individual planets; moving the individual planets while not moving the outer planetary system; and moving only certain individual planets while not moving others. Again, each of the movements may be in the x, y, and/or z direction, as well as tilt, relative to the thermal source to provide a more uniform deposition layer.

Still, in some embodiments, the substrate holder and/or individually controlled sections of the substrate holder may move in the x, y, and/or z direction, as well as tilt, relative to a non-moving thermal source. Further, in some embodiments, the ion source 445 may also be moved to assist in creating a uniform deposition layer.

In certain embodiments, the ICE Core fabrication system 400 may preprogrammed to control the movement of the thermal source and/or the substrate holder based on the results of a trial and error process to determine the optimal movement/position of the thermal source and/or the substrate holder that yields the highest percentage of uniform ICE Cores. For example, the trial and error process may include moving the thermal source in only one direction relative to the substrate holder and assessing the quality of the produced ICE Cores, then moving the thermal source in two direction and assessing the quality of the produced ICE Cores, and then then moving the thermal source in three direction and assessing the quality of the produced ICE Cores. Similarly, the trial and error process may also include moving only the substrate holder or a portion of the substrate holder relative to the thermal source in one, two, or three directions, and assessing the quality of the produced ICE Cores. Additionally, the trial and error process may also include moving both the thermal source and the substrate holder relative to one another, and assessing the quality of the produced ICE Cores. The exact movements (e.g., timing, distance, amplitude, frequency, etc.) may be adjusted during the trial and error process to determine the optimal movements that yields the highest percentage of uniform ICE Cores.

Additionally, in some embodiments, the ICE Core fabrication system 400 may be configured to stop/block or reduce the thermal source plume while moving the substrate holder and/or the thermal source. This may occur for a particular movement or during all moves. The movement may be subtle, rapid, on a linear stage, and/or rotated about an axis. Additionally, the movement may follow a random motion, sinusoidal motion, trapezoidal motion, and other types of dimensions.

Alternatively, or in addition to being preprogrammed based on the trial and error process described above, in some embodiments, the ICE Core fabrication system 400 may be configured to automatically control and adjust the movement of the substrate holder and/or the substrate holder during the deposition process based on real-time measurements obtained using one or more of the various components and sensors of the ICE Core fabrication system 400.

For instance, in one embodiment, the ICE Core fabrication system 400 may include a test glass changer 420 for securing an optical monitor test chip 435 for performing real-time analysis using the spectrometer 416, ellipsometers 430, and the optical monitor assembly 460. In one embodiment, the optical monitor assembly 460 may be configured to evaluate the performance of the ICE Core in situ. For example, the optical monitor assembly 460 may utilize any number of wavelengths to measure the transmittance, reflectance, and absorption of the ICE Cores during one or more of the manufacturing steps within the vacuum chamber 405. The spectrometer 416 may be configured to perform full spectrum analysis and real-time chamber characterizations. For example, the spectrometer 416 may be configured to control reflectance and transmittance of layers during thin-film deposition based on analysis of the optical monitor test chip 435. The vacuum chamber 405 can be configured to allow individual optical monitoring or combinations of optical monitoring. For example the ellipsometer 430 can be made on a different optical monitoring chip 435 than that of the optical monitoring system 460. Alternatively, the optical monitoring system and the full spectrum measurement spectrometer 416 can be configured to monitor different optical monitor test chip 435.

The test glass changer 420 may be utilized to facilitate optically measuring layer properties of the optical monitor test chip 435. In one embodiment, the test glass changer 420 may be fixed in position. In another embodiment, the test glass changer 420 may connect to or move along with the planetary drive 410 and the planetary assembly 415. The test glass changer 420 in the optical monitor test chip 435 are configured to receive each of the layers or treatments introduced in the vacuum chamber 405 to monitor in real-time the deposition process.

The ellipsometer ports 430 are configured to receive one or more ellipsometers (not shown) for investigating the dielectric properties (complex refractive index or dielectric function) of thin films. The ellipsometers may be used to characterize composition, roughness, thickness (depth), crystalline nature, doping concentration, electrical conductivity, and other material properties. The ellipsometers are very sensitive to the change in the optical response of incident radiation that interacts with the material being investigated, such as the optical monitor test chip 435.

The quartz heaters 440 may represent any number of heating devices, components or elements. In one embodiment, the quartz crystals may be incandescent lamps filled with highly pressurized halogen gas and other elements utilized to protect a filament and increase longevity. The lamps may be made out of a quartz glass because of its hotter melting point than standard class, thus the name quartz heaters 440. The quartz heaters 440 may emit infrared energy and may be particularly effective in the ICE Core system 400 due to their rapid heater response and high power density. The quartz heaters 440 may also be utilized to direct radiation in a uniform and concentrated pattern. In one embodiment, the quartz heaters 440 may control the temperature of the substrate within the vacuum chamber 405 in real-time to ensure proper deposition of materials as well as other process steps imposed upon the substrates connected to the planetary assembly 415.

In one embodiment, the ion source 445 may be an electro-magnetic device that is used to create charged particles. The source ions (i.e., gallium ions) generated by the ion source 445 may be focused broadly or narrowly onto the substrates and ICE Cores utilizing one or more electrostatic lenses. The ion source 445 may be utilized to assist thermal deposition. The ion source 445 may offer the advantage of extremely high deposition rates combined with the desired real and imaginary refractive index (n and k), Crystal stress reduction, and improve film adhesion compared with thermal deposition alone. The ion source 445 may also reduce total deposition times by as much as a factor of 30. Utilizing the ion source 445 may help control the density and crystal structure of the deposited material on the substrate. For example, any number of stresses and voids may be avoided as well as poor adhesion to the substrate, cracking the films, and varying optical properties may be avoided by utilizing the ion source 445. The ion beam emitted by the ion source 445 enables the condensing deposit material electrons to mobilize, thereby increasing the resultant density (and also real index of refraction) and material adhesion.

The n and k values of each layer of the ICE Core and the ICE Core overall may be considered critical parameters. The ion source 445 may vary the intensity or strength in real time as an independent and highly accurate real-time fine tune control to obtain the desired optical properties of each layer of the ICE Core and the ICE Core overall.

The e-beam sources 455 and the source shutters 450 may be utilized to perform electron beam physical vapor deposition (EBPVD). In one embodiment, the e-beam sources provide a system for elevating temperatures of a deposition material within the e-beam sources (e.g. a crucible or other container) for distribution into the vacuum chamber 405. For example, a high energy electron beam may be utilized to excite a deposition material that is released through the source shutters 450 which control the dispersion rate and pattern into the vacuum chamber 405. In one embodiment, the source shutters 450 may provide a regulator for controlling the deposition materials released from the e-beam sources 455. In addition to e-beam deposition, the ICE Core fabrication system 400 may be configured to perform resistive heating deposition, electromagnetic source deposition, and inductive heating deposition.

In one embodiment, the ion source 445 and the e-beam sources 455 may adjust at least one of the direction, power, intensity, and other parameters directed toward a substrate mounted on the planetary assembly 415 to control deposition and therefore transmission shape of the ICE Cores. The real time monitoring of the substrate utilizing the various sensors and measurement devices of the vacuum chamber 405 may be utilized to compensate for small derivations and drift and to maintain a desired transmission shape that may be associated with a target design. The utilization of e-beam and ion assisted e-beam deposition as described herein is unique for ICE Core manufacturing.

In one embodiment, the transmission values of the ICE Cores may vary as a function of wavelength utilized to perform the manufacturing processes. The various processes are distinct from other semiconductor processes utilized for interference, cut-off, or notch filters that limit information to that extractable relative to bandwidth in the optical spectrum. In one embodiment, the ICE Cores may be utilized to derive information that is in a greater resolution than the bandwidth utilized to take the readings with the ICE Cores. The increased resolution as compared to the bandwidth makes the ICE Cores and manufacturing processes unique.

The various components and sensors of the ICE Core fabrication system 400 may measure performance metrics to establish transmission, reflection, and absorption functions of the ICE Core during the manufacturing process. For example, the ion source 445 and the e-beam sources 455 may be actively managed and controlled to affect the transmission, reflection, and absorption function of the ICE Cores.

In accordance with the disclosed embodiments, the use of the ion assisted e-beam deposition process system may be used in conjunction with or separate from the disclosed system and method for translating a position of a thermal source and/or a substrate holder as described above.

In one embodiment, the batch to batch variability of the layer depositions and other processes may be tracked and recorded in one or more databases. As a result, the exact times, temperatures, voltage, current, compositions, intensities, distances, speeds, moisture, and other factors utilized by the ICE Core fabrication system 400 may be duplicated across a number of other ICE Core fabrication systems whether locally or remotely located to provide consistent results. Individual component variances may be recorded and duplicated as necessary.

The previous detailed description is of a small number of embodiments for implementing the claimed inventions and is not intended to limit the scope of the appended claims. For instance, although the ICE Core fabrication system 400 illustrates the use of planetary system type substrate holders, other types of substrate holders may be employed in accordance with the disclosed embodiments. As non-limiting examples, the substrate holders may be a plate or the planets themselves could be the substrate. Similarly, although the ICE Core fabrication system 400 illustrates two thermal sources and two planetary systems, the ICE Core fabrication system 400 may have any number of thermal sources and any number of substrate holders.

In addition, although the disclosed system and method for translating the thermal source and/or the substrate holder is described along with an ion assisted e-beam system (i.e., ICE Core fabrication system 400) and method, the disclosed system and method for translating the thermal source and/or the substrate holder is not limited this particular type of deposition system. For example, the disclosed system and method for translating the thermal source and/or the substrate holder may be applied to other systems such as, but not limited to, reactive magnetron systems, which uses a rotating drum, where the drum holds the substrate that rotates around an axis and a reactive magnetron system (i.e., another type of thermal source) moves relative to the drum. In this type of system, the thermal source may be moved relative to the substrate in similar fashion as described above for improving the uniformity of the ICE Cores. Similarly, the disclosed system and method for translating the thermal source and/or the substrate holder may be applied to atomic layer deposition (ALD) and strong layer deposition processes as well.

In addition to the embodiments described above, many examples of specific combinations are within the scope of the disclosure, some of which are detailed below.

Example 1

A method for manufacturing an integrated computational element (ICE) core, the method comprising:
varying a distance between a thermal component relative to a substrate holder that holds at least one substrate during a thin film deposition process to improve uniformity of the ICE core.

Example 2

The method according to Example 1, wherein varying the distance between the thermal component relative to the substrate holder that holds at least one substrate includes moving the thermal component in an x-direction.

Example 3

The method according to Example 1, wherein varying the distance between the thermal component relative to the substrate holder that holds at least one substrate includes moving the thermal component in a y-direction.

Example 4

The method according to Example 1, wherein varying the distance between the thermal component relative to the substrate holder that holds at least one substrate includes moving the thermal component in a z-direction.

Example 5

The method according to Example 1, wherein varying the distance between the thermal component relative to the substrate holder that holds at least one substrate includes moving the thermal component in at least two directions.

Example 6

The method according to Example 1, wherein varying the distance between the thermal component relative to the substrate holder that holds at least one substrate includes moving the thermal component in three directions.

Example 7

The method according to Example 1, wherein varying the distance between the thermal component relative to the substrate holder that holds at least one substrate includes moving at least a portion of the substrate holder in at least one direction relative to the thermal component during the thin film deposition process.

Example 8

The method of Example 7, wherein the substrate holder is a planetary system.

Example 9

The method according to Example 8, wherein at least one planet within the planetary system is moved relative to the thermal component while not rotating the planetary system as a whole.

Example 10

The method according to Example 1, wherein varying the distance between the thermal component relative to the substrate holder that holds at least one substrate includes moving at least a portion of the substrate holder in at least one direction relative to the thermal component and also moving the thermal component in at least one direction relative to the substrate holder during the thin film deposition process.

Example 11

The method according to Example 1, further comprising subjecting the at least one substrate to an ion beam source.

Example 12

The method according to Example 11, further comprising:
varying at least one of the power to the thermal source or the intensity of the ion beam source to control the shape of the ICE core.

Example 13

The method according to Example 1, wherein varying the distance between the thermal component relative to the substrate holder that holds at least one substrate is performed based on real-time in-situ measurements obtained during the thin film deposition process.

Example 14

The method according to Example 1, wherein varying the distance between the thermal component relative to the substrate holder that holds at least one substrate is performed based on a predetermined set of movements determined to improve uniformity of the ICE core.

Example 15

A system for manufacturing ICE cores, the system comprising:

a vacuum chamber;
a substrate platen located within the vacuum chamber; and
a source of a material for deposition on a substrate of the substrate platen to form the ICE cores; wherein at least one of the substrate platen and the material source is movable to vary a distance between the substrate platen and the material source.

Example 16

The system according to Example 15, wherein the material source is a thermal evaporation source.

Example 17

The system according to Example 15, wherein the substrate platen rotates.

Example 18

The system according to Example 15, further comprising:
at least two sensors for obtaining real-time measurements for determining a uniformity of layers of the ICE cores; and
logic configured to execute a set of instructions for moving at least one of the substrate platen and the material source based on the real-time measurements to improve the uniformity of the layers of the ICE cores.

Example 19

The system according to Example 15, further comprising logic configured to execute a set of instructions for moving at least one of the substrate platen and the material source based on the set of predetermined movements to improve the uniformity of layers of the ICE cores.

Example 20

The system according to Example 15, further comprising an ion beam focused on the substrate platen.

Example 21

The system according to Example 15, wherein the material source is deposited using a reactive magnetron system.

The following claims set forth a number of the embodiments of the invention disclosed with greater particularity.

The invention claimed is:

1. A method for manufacturing an integrated computational element (ICE) core, the method comprising:
varying a distance between a thermal component relative to a substrate holder that holds at least one substrate during a thin film deposition process to improve uniformity of the ICE core;
subjecting the at least one substrate to ions produced by an ion source;
evaluating the performance of the ICE core in situ via an optical monitor assembly;
adjusting the deposition of the material in response to the performance of the ICE core; and
varying at least one of the power to the ion source or the intensity of the ion source by varying parameters of the ion source to control the shape of the ICE core.

2. The method according to claim 1, wherein varying the distance between the thermal component relative to the substrate holder that holds at least one substrate includes moving the thermal component in an x-direction.

3. The method according to claim 1, wherein varying the distance between the thermal component relative to the substrate holder that holds at least one substrate includes moving the thermal component in a y-direction.

4. The method according to claim 1, wherein varying the distance between the thermal component relative to the substrate holder that holds at least one substrate includes moving the thermal component in a z-direction.

5. The method according to claim 1, wherein varying the distance between the thermal component relative to the substrate holder that holds at least one substrate includes moving the thermal component in at least two directions.

6. The method according to claim 1, wherein varying the distance between the thermal component relative to the substrate holder that holds at least one substrate includes moving the thermal component in three directions.

7. The method according to claim 1, wherein varying the distance between the thermal component relative to the substrate holder that holds at least one substrate includes moving at least a portion of the substrate holder in at least one direction relative to the thermal component during the thin film deposition process.

8. The method of claim 7, wherein the substrate holder is a planetary system.

9. The method according to claim 8, wherein at least one planet within the planetary system is moved relative to the thermal component while not rotating the planetary system as a whole.

10. The method according to claim 1, wherein varying the distance between the thermal component relative to the substrate holder that holds at least one substrate includes moving at least a portion of the substrate holder in at least one direction relative to the thermal component and also moving the thermal component in at least one direction relative to the substrate holder during the thin film deposition process.

11. The method according to claim 1, wherein varying the distance between the thermal component relative to the substrate holder that holds at least one substrate is performed based on real-time in-situ measurements obtained during the thin film deposition process.

12. The method according to claim 1, wherein varying the distance between the thermal component relative to the substrate holder that holds at least one substrate is performed based on a predetermined set of movements determined to improve uniformity of the ICE core.

13. A system for manufacturing ICE cores, the system comprising:
    a vacuum chamber;
    a substrate platen located within the vacuum chamber;
    a source of a material for deposition on a substrate of the substrate platen to form the ICE cores; wherein at least one of the substrate platen and the material source is movable to vary a distance between the substrate platen and the material source;
    an ion source focused on the substrate platen, the ion source configured to vary the power to the ion source or the intensity of the ion source by varying parameters of the ion source to control the shape of the ICE core; and
    an optical monitor assembly configured to evaluate the performance of the ICE core in situ.

14. The system according to claim 13, wherein the material source is a thermal evaporation source.

15. The system according to claim 13, further comprising: at least two sensors for obtaining real-time measurements for determining a uniformity of layers of the ICE cores; and logic configured to execute a set of instructions for moving at least one of the substrate platen and the material source based on the real-time measurements to improve the uniformity of the layers of the ICE cores.

16. The system according to claim 13, further comprising logic configured to execute a set of instructions for moving at least one of the substrate platen and the material source based on the set of predetermined movements to improve the uniformity of layers of the ICE cores.

17. The system according to claim 13, wherein the material source is deposited using a reactive magnetron system.

* * * * *